(12) United States Patent
Batra et al.

(10) Patent No.: US 11,698,788 B2
(45) Date of Patent: Jul. 11, 2023

(54) PATH SIMPLIFICATION FOR COMPUTER GRAPHICS APPLICATIONS

(71) Applicant: ADOBE INC., San Jose, CA (US)

(72) Inventors: Vineet Batra, Delhi (IN); Ankit Phogat, Noida (IN); Daniel Kaufman, Seattle, WA (US)

(73) Assignee: Adobe Inc., San Jose, CA (US)

( * ) Notice: Subject to any disclaimer, the term of this patent is extended or adjusted under 35 U.S.C. 154(b) by 5 days.

(21) Appl. No.: 16/805,643

(22) Filed: Feb. 28, 2020

(65) Prior Publication Data

US 2021/0271474 A1 Sep. 2, 2021

(51) Int. Cl.
G06F 9/30 (2018.01)
G06F 17/13 (2006.01)
G06F 9/38 (2018.01)

(52) U.S. Cl.
CPC ........ *G06F 9/30036* (2013.01); *G06F 9/3877* (2013.01); *G06F 9/3897* (2013.01); *G06F 17/13* (2013.01)

(58) Field of Classification Search
CPC .............................. G06T 11/203; G06T 17/30
See application file for complete search history.

(56) References Cited

U.S. PATENT DOCUMENTS

| 5,500,927 A * | 3/1996 | Sander-Cederlof ......................... G06T 11/203 345/442 |
| 2004/0113910 A1* | 6/2004 | Tsai ........................ G06T 17/30 345/420 |
| 2009/0040218 A1* | 2/2009 | Museth ................... G06T 17/30 345/420 |
| 2019/0287302 A1* | 9/2019 | Bhuruth .............. G06F 3/04847 |

OTHER PUBLICATIONS

Predrag S. Stanimirovic Marko B. Miladinovi, Accelerated gradient descent methods with line search, Numer Algor (2010) 54:503-520, DOI 10.1007/s11075-009-9350-8 (Year: 2010).*

Junyeong Yang and Hyeran Byun, Curve Fitting Algorithm Using Iterative Error Minimization for Sketch Beautification, 2008 19th International Conference on Pattern Recognition (Year: 2008).*

(Continued)

*Primary Examiner* — Weiming He
(74) *Attorney, Agent, or Firm* — Shook, Hardy & Bacon L.L.P.

(57) ABSTRACT

Systems and methods provide for efficiently and accurately determining a simplified path that conforms to the geometry of an original path by simultaneously minimizing the deviation from the original path and reducing the number of anchor points in the simplified path. A simplified path may be iteratively generated by updating parametric values and anchor points for candidate simplified paths at epochs. A deviation in distance between points on the original path and corresponding points on candidate paths may be iteratively decreased to ensure that the resulting simplified path follows the geometry of the original path to a predetermined threshold. Continuity constrains can also be applied to ensure smoothness of the simplified path.

20 Claims, 7 Drawing Sheets

(56) References Cited

OTHER PUBLICATIONS

Lu, L. (2015). Explicit algorithms for multiwise merging of Bézier curves. Journal of Computational and Applied Mathematics, 278, 138-148.

Nocedal, J., & Wright, S. (2006). Numerical optimization. Springer Science & Business Media. 2nd Edition. Chapters 2 (pp. 10-29), 3 (pp. 30-65), 7 (pp. 164-191), 11 (pp. 270-303), 18 (pp. 529-562), and 19 (pp. 563-597).

\* cited by examiner $$F(p) = \frac{1}{2}\left(\int_0^{\frac{1}{3}} \|B(t)p - B(3t)p_0\|^2 dt + \int_{\frac{1}{3}}^{\frac{2}{3}} \|B(t)p - B(3t-1)p_1\|^2 dt + \int_{\frac{2}{3}}^1 \|B(t)p - B(3t-2)p_2\|^2 dt\right) \leftarrow 202$$

$$F(p) = \frac{1}{2}p^T A p - p^T(B_1 p_0 + B_2 p_1 + B_3 p_3) + c(p_0, p_1, p_3) \leftarrow 204$$

$$p^* = argmin_p \frac{1}{2}p^T A p - p^T(B_1 p_0 + B_2 p_1 + B_3 p_3) \leftarrow 206$$

$$A = \int_0^1 B(t)^T B(t) dt \leftarrow 208$$

$$B_1 = \int_0^{\frac{1}{3}} B(t)^T B(3t) dt \leftarrow 210$$

$$B_2 = \int_{\frac{1}{3}}^{\frac{2}{3}} B(t)^T B(3t-1) dt \leftarrow 212$$

$$B_3 = \int_{\frac{2}{3}}^1 B(t)^T B(3t-2) dt \leftarrow 214$$

$$p^* = argmin_p \frac{1}{2}p^T A p - p^T \left(\sum_{j \in [0, m-1]} B_j p_j\right) \leftarrow 216$$

$$B_j = \int_{a_j}^{a_{j+1}} B(t)^T B\left(\frac{t - a_j}{a_{j+1} - a_j}\right) dt \leftarrow 218$$

$$argmin_{c_1, \ldots, c_\ell} \sum_{k \in [1, \ell]} \left(\frac{1}{2} c_k^T A c_k - c_k^T \left(\sum_{j \in [k_{start}, k_{end}]} B_j p_j\right)\right) \leftarrow 220$$

FIG. 2A $$D(t_i) = |C(t_i) - P_i| \cdot C'(t_i) \quad \leftarrow 242$$

$$t_i \leftarrow t_i - \alpha \frac{D(t_i)}{D'(t_i)} \quad \leftarrow 244$$

FIG. 2B $$g_{G1}(p) = \frac{(c_4 - c_3)}{\|c_4 - c_3\|} \cdot \frac{(d_2 - d_1)}{\|d_2 - d_1\|} = 1 \quad \leftarrow 262$$

$$g_\|(p) = \Delta d^T \Delta c^\perp \quad \leftarrow 264$$

$$\nabla g_\|(p^k)^T p + g_\|(p^k) = 0 \quad \leftarrow 266$$

$$\min_p 1/2 p^T A p - p^T b \ \ s.t. \ Cp = d \quad \leftarrow 268$$

$$Ap - b + C^T \lambda = 0 \quad \leftarrow 270$$

$$Cp = d \quad \leftarrow 272$$

$$\begin{pmatrix} A & C^T \\ C & 0 \end{pmatrix} \begin{pmatrix} p \\ \lambda \end{pmatrix} = \begin{pmatrix} b \\ d \end{pmatrix} \quad \leftarrow 274$$

FIG. 2C

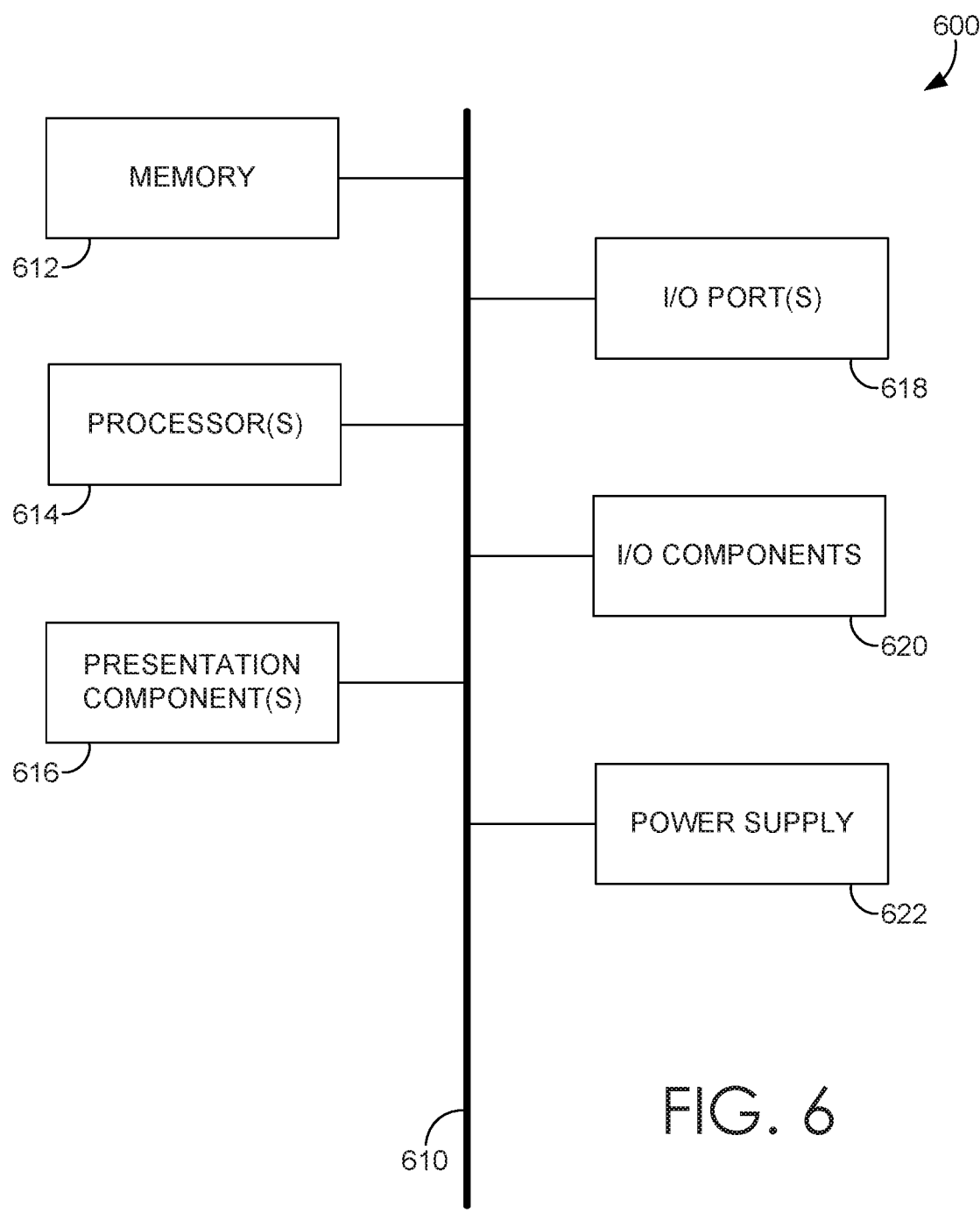

PATH SIMPLIFICATION FOR COMPUTER GRAPHICS APPLICATIONS

BACKGROUND

Computer graphics applications enable users to design a variety of graphics, such as logos, icons, marketing materials, and charts. In the context of computer graphics, two-dimensional vector graphics are often used to create content via geometries. Specifically, Bezier splines are commonly used to create content in various computer graphics applications, such as Illustrator®, Sketch®, Coral Draw®, to name a few. However, computer-based geometries involve a large number of segments and anchor points (e.g., control points). As a result, storing these geometries often requires a substantial storage space, and operating on them requires substantial computational time and resources. In order to comply with the storage and computational resources requirements, algorithms can be applied to such geometries to perform tasks such as path simplification.

Generally, path simplification in computer graphics refers to simplifying a path (e.g., curve, spline, line, geometry) by reducing anchor points that define the geometry of the path. The simplified path aims to follow the geometry of the original path with fewer anchor points. Path simplification can ultimately be used to perform various tasks, including path modification, path rendering, saving operations, etc. For example, a geometry can be modified using anchor points on a simplified path by dragging handles corresponding to the anchor points.

However, path simplification often requires balancing the need for fewer anchor points with the need for accurately following the original path of a geometry. This is especially true for complex geometries involving a large number of distinct curves, turns, etc. Current automated path simplification solutions are inadequate in providing such balance. In the absence of suitable assistance, users manually modify the original geometry by moving multiple anchor points to conform to the desired shape. In some cases, the cost and tedium of manual modification of the original geometry may lead the user to limit the complexity of the geometry or to accept subpar content, thereby limiting the usability of the computer graphics applications.

SUMMARY

Embodiments of the present invention are directed to a path simplification system to efficiently and accurately determine a simplified path that conforms to the original path by simultaneously minimizing the deviation from the original path and reducing the number of anchor points in the simplified path. In this regard, a simplified path may be generated for an original path representing a geometry to be simplified. Generally, an original path includes initial anchor points and corresponding initial segments connecting the initial anchor points. An initial simplified path may be generated by assuming initial parametric values and initial candidate anchor points that define the initial simplified path. A simplified path may be determined by iteratively generating candidate simplified paths until a deviation of a current candidate simplified path from the original path is less than a predetermined deviation threshold.

In this regard, the candidate parametric values and the candidate anchor points of the initial simplified path may be iteratively updated at each iteration until the deviation between a candidate simplified path and the original path is below the threshold. The threshold may be determined based on a user provided accuracy or deviation value. In response to a deviation of a current candidate simplified path being below the predetermined threshold, the current candidate simplified path may be presented to the user. In some examples, the current candidate simplified path may be appended to the original path. In some examples, separate simplified paths may be generated for sections or portions of the original path. The simplified paths for each section may be joined together using a continuity constraint to ensure continuity between the paths.

As such, an improved simplified path may be generated by iteratively updating candidate parametric values and candidate anchor points until the geometry of a simplified path conforms with geometry of the original path to a predetermined threshold accuracy or deviation. This enables the system to generate a simplified path for an original path without compromising the accuracy of the geometrical shape of the original path to be simplified.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

The present invention is described in detail below with reference to the attached drawing figures, wherein:

FIGS. 2A-2C are diagrams illustrating exemplary algorithms suitable for generating or determining a simplified path, in accordance with some implementations of the present disclosure;

FIG. 6 is a block diagram of an exemplary computing environment suitable for use in implementations of the present disclosure.

DETAILED DESCRIPTION

Figure 1:
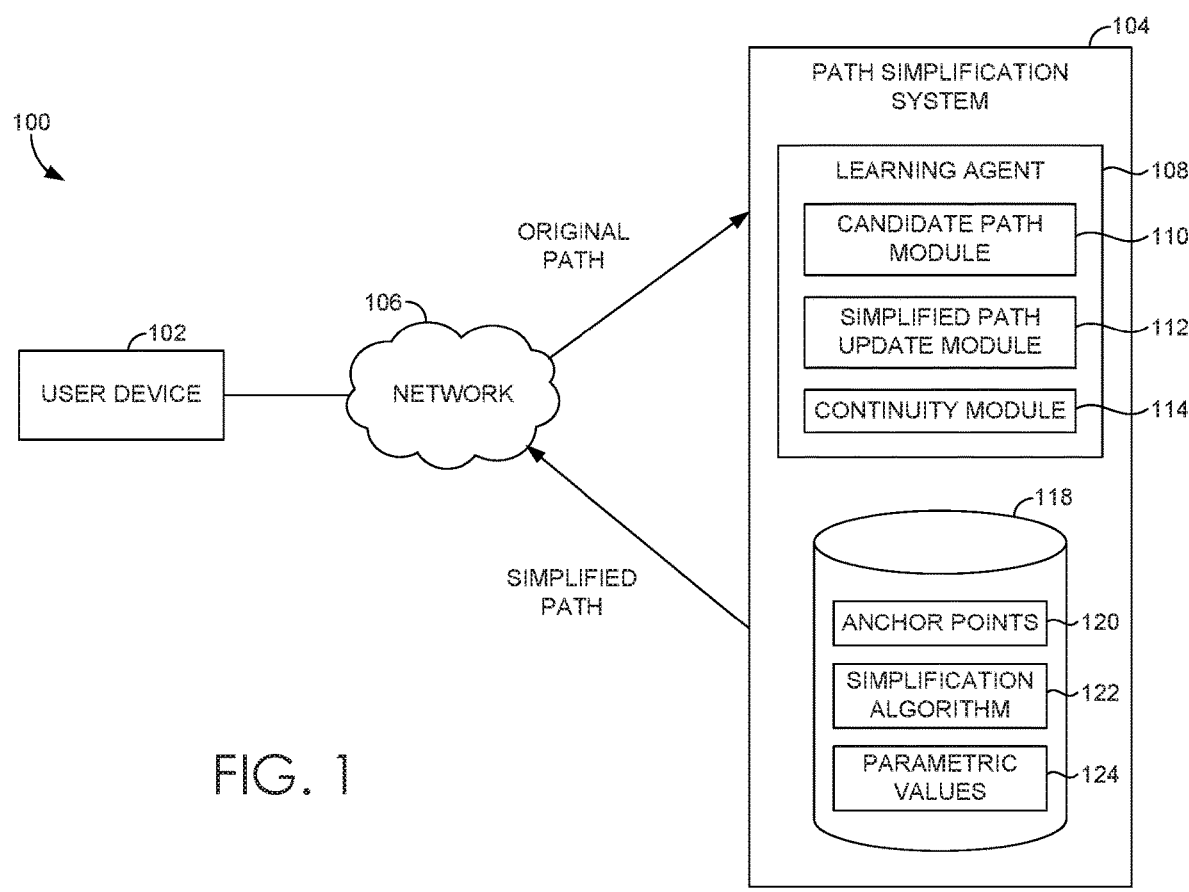
FIG. 1 is a block diagram illustrating an exemplary system in accordance with some implementations of the present disclosure.

Computer graphics applications, such as Adobe Illustrator®, enable users to design a variety of graphics or content, such as logos, icons, marketing materials, and charts, for many different types of media. Such graphics often include curves (e.g., paths, lines, splines) that define the geometry of various shapes in the content. For example, an artwork may include a geometrical shape defined using a Bezier spline. Typically, a Bezier spline (e.g., Bezier path, Bezier curve) includes multiple continuous Bezier segments that are each defined by anchor points (e.g., control points). For example, cubic Bezier segments are commonly used to define geometries in vector graphics. A curve in a cubic Bezier segment is defined by four anchor points, including two end points which the curve passes through and two additional points (that the curve does not pass through) that control tangent vectors passing through the respective end points. An input path including multiple cubic Bezier segments may be used to define a geometry in a computer graphics application. In order to comply with storage and/or computational restrictions associated with the computer graphics application, the input path can be simplified to include fewer segments than the input path. As such, a simplified path may be generated for multiple continuous segments of the input path such that the simplified path includes fewer segments than the input path while generally following the geometrical shape of the input path.

The presently available approaches for performing path simplification are unsatisfactory. One approach is to arbitrarily map or match segments from a simplified path to an original path. However, this approach is prone to errors. For example, this conventional approach assumes that the arbitrary mapping uses accurate parameterization for the simplified path. Further, this approach arbitrarily predicts a number of segments, defined by end points on the original path, for a simplified path. In this way, this approach fits a arbitrarily predicted simplified path to the original path. Often, this arbitrary prediction fails to provide an optimal simplified path as the simplified path may have a significant deviation from the original path. This deviation is higher for points in the path between the chosen end points as the error function is highly dependent on initially arbitrarily chosen points on the original path.

In cases where the arbitrarily determined simplified path overlaps the original path, the corresponding points with the same parametric values in the original and the simplified path may be farther away from each other in Euclidean space. The deviation between the simplified path and the original path may be erroneously determined to be higher for such an overlapping curve than it should be as the points on the simplified path are farther apart from the corresponding points on the original path. This further leads to difficulty with accurate filling of a simplified path to the original path.

Another presently available option includes sampling anchor points on the original path and fitting a single path to the sampled anchor points. However, sampling anchor points often leads to information loss, especially geometrical information between two consecutive anchor points. This may lead to inaccurate error measurement between the original path and the simplified path as the error is dependent on the anchor points and not the geometrical shape of the path itself.

Accordingly, embodiments of the present invention are directed to automatically generating an accurate simplified path for an original path. Generally, the automatically generated simplified path minimizes deviation from the original path while reducing the number of anchor points in the simplified path. In implementation, a path simplification system iteratively determines a simplified path for an input original path. A simplified path for an original path is a path (e.g., curve, line, spline) that generally conforms to the geometry (e.g., shape) of the original path with a reduced number of anchor points (e.g., control points) compared to the original path.

At a high level, in embodiments, a simplified path is generated for an original path by iteratively determining candidate simplified paths until an optimized path with a sufficiently decreased deviation from the original path is determined. An original path may include initial segments joining initial anchor points that define a geometry of the original path. As can be appreciated, anchor points define the geometry of the original path and, as such, may not be on the original path. A candidate simplified path may be defined using candidate anchor points (e.g., a subset of initial anchor points of the original path) and parametric values corresponding to end points of the original path. The end points correspond to points on the original path that together form the original path, and the parametric values define curves (e.g., shapes) between consecutive end points. The original path may be subdivided into segments to determine the end points. At each iteration, the candidate anchor points and the parametric values may be updated to decrease a deviation between the original path and the candidate simplified path at the current iteration compared to the prior iteration. The deviation may be determined based on distance between corresponding end points on the original path and the candidate simplified path. The candidate simplified paths may be updated until the deviation from the original path is sufficiently low, indicating that the candidate simplified path sufficiently follows the geometry of the original path. To determine whether the deviation from the original path is sufficiently low, the deviation at each iteration may be compared to a threshold deviation (e.g., fixed deviation, deviation obtained from a user). Once the deviation is below the threshold at an iteration, the candidate simplified path at that iteration may be determined to be the simplified path for the original path with the associated candidate anchor points and parametric values. The algorithm may further ensure continuity between resulting segments of the simplified path to soften the corners between the resulting segments joining the candidate anchor points. A penalty term may be introduced to the algorithm to ensure such continuity.

Generally, an original path includes initial segments that are each defined by a set of initial anchor points (e.g., control points). As described, the anchor points do not necessarily lie on the original path. The original path (e.g., Bezier spline, curve, shape, geometry) may be subdivided into a segments (subdivided segments) based on length and curvature of the initial segments of the original path. In some examples, each initial segment of the original path may be divided into subdivided segments. Each subdivided segment may be defined by a pair of end points that form the subdivided segment. Such end points generally correspond with the original path. The subdivided segments may ultimately be used to determine deviation between each subdivided segment and corresponding segment of the simplified path to ensure a tighter fit between the original path and the determined simplified path.

Upon segmenting an original path, an initial simplified path may be determined for the original path. The initial simplified path may include candidate anchor points and candidate segments joining the candidate anchor points based on initial parametric values corresponding to end points of the initial simplified path, the end points of the initial simplified path corresponding to the initial simplified path subdivided at the same end points as the subdivided segments of the original path. In this regard, for each end point of the initial simplified path, initial parametric values may be assumed (e.g., using arc length parameterization). A parametric value corresponds to a rate of change of a curve (e.g., shape) of the initial simplified path at the associated end point, such that the parametric values along with the end points define the shape of the initial simplified path. In this way, the parametric values define curves between consecutive end points. In some examples, arc length parameterization may be used to determine the initial parametric values for end points of subdivided segments of the initial simplified path. An initial simplified path may be defined using a quadratic solve corresponding to each subdivided segment of the initial simplified path based on the initial parametric values. Initial candidate anchor points for the simplified path may then be determined based on the initial parametric values. Initial candidate anchor points may be determined by combining (e.g., joining) multiple subdivided segments of the initial simplified path based on similarity between the initial parametric values for the end points of consecutive subdivided segments of the initial simplified path. In this way, the initial candidate anchor points follow the curve of the subdivided segments of the initial simplified path with fewer number of anchor points in the initial candidate anchor points than the number of anchor points in the initial anchor points of the original path. In some examples, the initial candidate anchor points may be determined using a least square method based on the quadratic solves of the subdivided segments of the initial simplified path. Consecutive initial candidate anchor points are determined such that they follow a length of the original path at parametric values that form a single curve (i.e., initial candidate segment). The initial simplified path may then be defined based on the initial candidate anchor points, the initial parametric values, and/or the initial candidate segments. The initial candidate segments may connect the initial candidate anchor points based on the parametric values associated with the end points of the initial simplified path. The parametric values associates with consecutive end points located between adjacent initial candidate anchor points may be used to generate the associated initial candidate segment connecting the adjacent initial candidate anchor points.

The initial simplified path may be optimized over iterations to determine a simplified path with a sufficiently low deviation from the original path. At each iteration, the initial parametric values may be optimized as candidate parametric values for the end points of the subdivided segments of candidate simplified paths. In some examples, gradient descent may be used to optimize parametric values. Further, at each iteration, a least square method may be employed to determine new candidate anchor points corresponding to each iteration of the candidate parametric value optimization. At each iteration, a distance function may be used to determine a deviation between the candidate simplified path and the original path. In some examples, the distance function may calculate a deviation between the candidate simplified path and the original path for each of the end points, and the deviation for a candidate simplified path may be a sum of the deviations for each of the end points for the corresponding iteration. When the deviation is determined to be below a predetermined deviation threshold, the path simplification system may output the corresponding candidate simplified path with the corresponding candidate anchor points and corresponding candidate segments determined based on the corresponding candidate parametric values for that iteration. The simplified path may be presented to a user. In some examples, the simplified path may be appended on the original path as vectors. In other examples, the simplified path may replace the original path.

In some examples, the above-described simplification process may be applied recursively if the deviation is higher than a predetermined error threshold. The error threshold may be determined based on a cumulative length of the initial segments of the original path and/or a user provided accuracy value. When the deviation exceeds the error (e.g., accuracy) threshold, the path simplification system may determine an end point of a segment of the set of segments where the deviation exceeds a predefined fraction (e.g., one-third, one-half) or percentage of the deviation. In such an example, a simplified path may be determined for a section of the original path before the determined end point and another simplified path may be determined for a section of the original path following the determined end point using the steps described above. In some examples, a continuity function may be employed to ensure continuity (e.g., smoothness) between end and starting points of the simplified paths.

Aspects of the technology described herein provide a number of advantages over previous solutions. For instance, one previous approach involves arbitrarily mapping or matching segments from a simplified path to an original path that assumes that the arbitrary mapping has used accurate parameterization for the simplifying curve and doesn't learn those parameters. However, assuming that the parameterization is accurate has a significant drawback when the assumed values are biased. To avoid such bias, implementations of the technology described herein, for instance, systematically develop an algorithm to iteratively learn the correct effect of parameterization on deviation from the original path while reducing the number of anchor points in the simplified path. Some other previous works addressed the problem of reducing the deviation from original path partially. The parameterization in this previous model, however, is less expressive as the same parametric values in the original and the simplified path often are parametric values for different points on the paths. Another previous work attempted to address the problem of lowering computation time by sampling points on the original path and fitting a single path to the sampled points. However, in that work, information between the sampled points is lost, leading to an inaccurate error calculation to fit the simplified curve. The algorithm used in that work does not use data availability to tradeoff with model expressiveness to further optimize the simplifying algorithm.

With reference now to the drawings, FIG. 1 is a block diagram illustrating an exemplary system 100 for using a learning agent 108 of a path simplification system 104 to provide a simplified path in response to obtaining an original path with anchor points 120, in accordance with implementations of the present disclosure. It should be understood that this and other arrangements described herein are set forth only as examples. Other arrangements and elements (e.g., machines, interfaces, functions, orders, and groupings of functions, etc.) can be used in addition to or instead of those shown, and some elements may be omitted altogether. Further, many of the elements described herein are functional entities that may be implemented as discrete or distributed components or in conjunction with other components, and in any suitable combination and location. Various functions described herein as being performed by one or more entities may be carried out by hardware, firmware, and/or software. For instance, various functions may be carried out by a processor executing instructions stored in memory.

The system 100 is an example of a suitable architecture for implementing certain aspects of the present disclosure. Among other components not shown, the system 100 includes a user device 102 interacting with a path simplification system 104 that is configured to provide a simplified path to the user device 102 in response to receiving an original path. Each of the components shown in FIG. 1 can be provided on one or more computing devices, such as the computing device 600 of FIG. 6, discussed below. As shown in FIG. 1, the user device 102 and the path simplification system 104 can communicate via a network 106, which may include, without limitation, one or more local area networks (LANs) and/or wide area networks (WANs). Such networking environments are commonplace in offices, enterprise-wide computer networks, intranets, and the Internet. It should be understood that any number of user devices and path simplification systems may be employed within the system 100 within the scope of the present invention. Each may comprise a single device or multiple devices cooperating in a distributed environment. For instance, the path simplification system 104 could be provided by multiple server devices collectively providing the functionality of the path simplification system 104 as described herein. Additionally, other components not shown may also be included within the network environment.

The path simplification system 104 is generally configured to provide simplified paths to user devices, such as the user device 102, in response to receiving or obtaining an original path from user devices. This could be simplified paths within the context of any of a variety of different types of applications. The user device 102 can access and communicate with the path simplification system 104 via a web browser or other application running on the user device 102 via the network 106. Alternatively, in other embodiments, the path simplification system 104 or portions thereof can be provided locally on the user device 102.

At a high level, the path simplification system 104 includes a learning agent 108 that is configured to provide simplified paths to the user device 102 by iteratively optimizing a candidate simplified path at iterations till a deviation threshold is met. At each iteration, the learning agent 108 determines a current candidate simplified path for an original path based on a previous candidate simplified path. Information is returned regarding a deviation between the original path and the current candidate simplified path after determining the candidate simplified path for the current iteration. A current candidate simplified path is derived based on the previous candidate simplified path and the corresponding deviation. Thereafter, an improved simplified path is provided to the user device 102 when the deviation for a current simplified path is below a pre-determined threshold deviation. The learning agent 108 uses such information to improve its path simplification algorithm at each iteration. While only a single user device 102 is shown in FIG. 1, it should be understood that the learning agent 108 may be configured to interact with any number of user devices.

The learning agent 108 includes a candidate path module 110, a simplified path update module 112, and a continuity module 114. The candidate path module 110 is configured to determine a current candidate simplified path for an iteration based on a previous simplified path and the simplified path update module 112. Each candidate simplified path is determined based on information that can include one or more previous candidate simplified paths and one or more previous deviations from the original path as determined by the learning agent 108 over a session between the user device 102 and the path simplification system 104.

Initially, at first iteration, the candidate path module 110 is configured to determine an initial candidate simplified path for an original path obtained from user device 102. The original path may include one or more curves (e.g., paths, lines, splines) defining a geometry of a shape using multiple continuous initial segments, each initial segment defined by initial anchor points (e.g., control points). In some examples, the original path may be a Bezier spline (i.e., Bezier path, Bezier curve) including multiple initial segments (e.g., Bezier segments), each initial segment defined by initial anchor points. For example, each cubic Bezier segment may include four anchor points, two end points on the path and two points (not on the path) controlling the tangent vectors passing through the end points. A path, P, may include n initial segments defined as anchor point vectors, with each initial segment (e.g., anchor point vector) defined as, $p_j = (p_{1,j}, p_{2,j}, p_{3,j}, p_{4,j}) \in \mathbb{R}^8$.

The candidate path module 110, at the first iteration, may be configured to determine an initial candidate simplified path, P, that fits the original path. The initial candidate simplified path, P, may be an initial guess for a candidate simplified path, including a decreased number of initial candidate anchor points as compared to the original path. The original path may be subdivided into a set of subdivided segments based on a length and a curvature of the initial segments (i.e., multiple segments of the original path) of the original path. In some examples, the initial segments of the original path may be subdivided to form the subdivided segments, each subdivided segment defined by a pair of end points on the original path. Initial parametric values may be determined for each end point for a candidate initial simplified path defining the subdivided segments in the initial candidate simplified path. The end points of the candidate initial simplified path may correspond to the end points of the subdivided segments of the original path on a one-to-one basis. The parametric values define a shape or a curve of the path at the associated end points. In some examples, arc length parameterization may be used to determine the initial parametric values, t, for the end points in the initial candidate simplified path. A subdivided segment may be parameterized by $t \in [0,1]$. Each subdivided segment may then be parameterized as $b(t, p_j) = B(t)p_j$, where the parameterization for each end point in a subdivided segment may be defined as $B(t) = ((1-t)^3, 3(1-t)^2 t, 3(1-t)t^2, t^3) \otimes Id_2$. In some examples, the candidate path module 110 may select a set of m consecutive subdivided segments of the original path to simplify with a single candidate simplified path. In such examples, candidate simplified paths for each set of m subdivided segments may be determined and iteratively updated. In other examples, the candidate path module 110 may determine a single candidate simplified path to simply all subdivided segments of the original path. The initial candidate simplified path may be defined based on the subdivided segments and the corresponding initial parametric values for their associated end points. In some examples, the initial candidate path may be defined using a quadratic solve for each subdivided segment of the initial candidate path. Initial candidate anchor points may be determined by combining (e.g., joining) multiple consecutive subdivided segments of the initial simplified path based on similarity between the initial parametric values for the end points of consecutive subdivided segments of the initial simplified path. In this way, the initial candidate anchor points follow the curve of the subdivided segments of the initial simplified path with fewer number of anchor points in the initial candidate anchor points than the number of anchor points in the initial anchor points of the original path. A least square solve may further be employed to determine a set of initial candidate anchor points for the initial candidate simplified path based on the quadratic solve. Consecutive initial candidate anchor points may be determined such that they follow a length of the original path at parametric values that form a single curve (i.e., initial candidate segment). The initial candidate simplified path may then be defined using the set of initial candidate anchor points and initial candidate segments connecting the initial candidate anchor points based on the parametric values of end points between consecutive initial candidate anchor points.

The simplified path update module 112 includes an optimization algorithm that is used for selecting a candidate simplified path based on the current state, at each iteration. The optimization algorithm comprises a deviation or error function to determine a deviation of the candidate path from the previous iteration to a threshold deviation value. In some examples, the threshold deviation value may be determined based on a user selection of an accepted error or a deviation metric. In response to a deviation value being higher than the threshold deviation value, the simplified path update module 112 may update candidate parametric values for each previous candidate simplified path for each end point in a current candidate simplified path. In some examples, Newton-Raphson method may be used to update the candidate parametric values, for example, by using gradient descent. Further, the simplified path update module 112 may update a selection of the candidate anchor points for the current candidate simplified path based on the updated candidate parametric values. In some examples, a least square solve may be used to determine the updated candidate anchor points for the current candidate simplified path. In this way, the number of anchor points may be decreased for a candidate simplified path using a least square solve, allowing the candidate simplified path to only include anchor points that are necessary to follow the geometry of the original path.

A distance or deviation function may be used to determine a deviation between the candidate simplification path and the original path. The deviation may represent a distance or Euclidian distance between the geometry of the original path and the candidate simplified path. In some examples, a deviation may be determined for each of the end points of the subdivided segments that divides the original path and the corresponding end points of the candidate simplified path, and the deviation for the candidate simplified path may be a sum of deviations for each of the corresponding end points. In this way, a reduced degree of freedom may be ensured for the simplified path as the parametric velocity may be aligned at each end point of the subdivided segment of the original path, and thus, may result in tighter correspondence between the end points on the original path and the corresponding end points of the simplified path in Euclidean space. Candidate segments for the candidate simplified path at each iteration may be determined based on the corresponding candidate parametric values and the associated candidate anchor points. At each iteration, the candidate parametric values and the candidate anchor points for the current candidate simplified path may be updated until the deviation is below the pre-determined threshold. In this way, the deviation between the original path and the current candidate simplified path may be decreased at each epoch. An improved simplified path may be determined based on the candidate anchor points and candidate parametric values corresponding to the candidate simplified path for which the deviation is determined to be below the deviation threshold. The improved simplified path may be determined to be the simplified path for the original path. The candidate anchor points, the candidate segments and the candidate parametric values corresponding to the improved simplified path and the other candidate simplified paths may be stored in a data store 118 as anchor points 120 and parametric values 124, and subsequently retrieved by the candidate path module 110 and/or the simplified path update module 112. In this way, the path simplification system 115 can balance model expressiveness in terms of reduced number of anchor points while reducing the deviation from the original path to a certain threshold.

In some examples, the simplified path update module 112 may be further configured to, at each iteration, determine two or more separate portions of a current set of subdivided segments for further simplification. In such examples, the simplified path update module 112 may determine a deviation for the current candidate simplified path and compare it to a pre-determined error threshold. The error threshold may be determined based on a cumulative length of the initial segments of the original path being simplified in the current state, and/or a user provided accuracy value. In response to the deviation being above the error threshold in the current state, a point on the candidate simplified path may be determined where a point deviation exceeds a fraction (e.g., ½, ⅓) or a percentage of the total deviation. The current set of subdivided segments, m, may be portioned into two paths at the determined point and individual improved simplified paths may be determined using the above process for each of the two paths. As such, the present system may take into account sudden changes in geometry of the original path by fitting different improved simplified paths to varying geometries in the original path.

The continuity module 114 generally operates to generate a simplified path based on the one or more improved simplified paths determined for the original path. In some examples, the continuity module 114 may append the improved simplified paths to the corresponding original initial segments of the original path. In some examples, the continuity module may further apply a continuity function to the improved simplified paths to ensure continuity (e.g., smoothness) between end points corresponding to each of the improved simplified paths. The geometry of the original path may be utilized to determine the continuity function. In some examples, a G1 continuity algorithm may be applied to ensure continuity between the candidate segments defined by candidate anchor points of an improved simplified path. The continuous path, including those corresponding to each improved simplified path may then be used as a simplified path to append onto the original path. The simplified path alone or appended on to the original path may then be displayed on the user device 102. The resulting anchor points of the improved simplified path(s) may be included as anchor points on the simplified path, such that a user of the user device 102 may modify the geometry of the simplified path by modifying (e.g., dragging, moving) one or more anchor points.

By way of example only and not limitation, FIGS. 2A-2C present an algorithm for generating or determining a simplified path, in accordance with some implementations of the present disclosure. FIG. 2A presents an example algorithm for determining an initial candidate simplified path, p* based on an original path divided into n segments, with control points, $p_j$. Deviation F(p) 202 is an example distance function that may be used to determine a deviation between an example original path with three consecutive segments, $p_0$, $p_1$, $p_2$, that is to be simplified by a candidate simplified path, p. The deviation F(p) 202 may be a function used to minimize deviation between the original path and a candidate simplified path, p. The candidate simplified path, p, is configured to be equally divided in parameterization to approximate each matching segment. The closes fit path, p* 204 for an original path with three segments may then be determined as an argument of the minimum deviation F(p) 202 (i.e., p*=$\mathrm{argmin}_p$F(p)). A quadratic F(p) 206 is a quadratic denotation of the deviation function in a simplified form. In some examples, the constant, c($p_0$, $p_1$, $p_2$) may be disregarded to determine the closest fit path, p* 204, based on geometry of original path A 208, parameterized segment $B_1$ 210, parameterized segment $B_2$ 212, and parameterized segment $B_2$ 214. The geometry of original path A 208, parameterized segment $B_1$ 210, parameterized segment $B_2$ 212, and parameterized segment $B_2$ 214 may be computed as closed forms directly from the corresponding integrals.

Initial simplified path p* 216 for an original path with m subdivided segments, with subdivided segments j∈[0, m−1], may be determined as a generalization of the closes fit path, p* 204 determined as an initial simplified path for an original path with three segments. The initial simplified path p* 216 is parameterized with arbitrary amounts of its parameterization $[a_j, a_{j+1}] \subset [0,1]$, allocated sequentially to match each subdivided segment, j. Here, the original path A 208 and parameterized segment $B_1$ 218 are used to determine the initial simplified path that is a closest fit to the original path with parametric values based on arc length parameterization.

An initial simplified path p 220 with multiple simplified segments l may then be generated as a global equation. Every path subset k∈[1, l] simplified may contain subdivided segments with indices in $[k_{start}, k_{end}]$. A single candidate simplified path may be generated for the subset k with anchor points $c_k \in \mathbb{R}^8$. Adjacent candidate simplified paths may share a single candidate anchor point. For example, the last candidate anchor point of a candidate simplified path may be the same as the first candidate anchor point of the adjacent candidate simplified path, $c_{k,4}=c_{k+1,1}$. As can be seen, the initial simplified path p 220 is modeled as a linear solve with size in the number of initial candidate anchor points in the initial simplified paths. The matrix term comprises approximately entered diagonal entries of original path A 208, where entries may overlap where initial candidate anchor points are shared between adjacent candidate simplified paths.

FIG. 2B presents an example algorithm for updating the candidate parametric values and the candidate anchor points at each iteration. Parametric values in a current candidate simplified path may be updated at each iteration to iteratively improve the candidate parametric values. A least square solve for the candidate anchor points for current candidate simplified path may be interleaved with update of the candidate parametric values. After each least square solve, a Newton-Raphson method may be used to compute the updated parametric values of t using gradient descent 244. For each end point on the current candidate path, $C(t_i)$, and the subdivided segments of the original path $P_i$, a minimization function $D(t_i)$ 242 may be utilized to update the candidate parametric values, $a_j$ based on the gradient descent 244, where α is the velocity for the gradient descent modulated using a linesearch algorithm. Any known linesearch algorithm may be used. At each iteration, the newly updated candidate parametric values, $a_j$, with corresponding newly updated candidate anchor points may be used to define the new candidate simplified path using the same equation as used to determine the initial simplified path p 220. The deviation at each iteration may be determined using deviation F(p) 202 deviation function. When the deviation is below a threshold deviation, the candidate simplified path corresponding to the current iteration may be determined to be improved or resulting simplified path for the original path.

FIG. 2C presents an example algorithm for generating a simplified path based on the one or more improved simplified paths determined for the original path. A continuity module, such as the continuity module 114 of FIG. 1, may be used to generate a simplified path. A continuity constraint may be added to the improved simplified path(s) to ensure continuity (e.g., smoothness) of the simplified path. For a path p with two resulting segments, the simplified path can be described as, $p=(c^T, d^T)^T$, and the resulting segments may be defined as $c=(c_1, c_2, c_3, c_4)^T$ and $d=(d_1, d_2, d_3, d_4)^T$. The continuity constraint $g_{G1}(p)$ 262 is a non-linear and vector-valued G1 continuity constraint to ensure smoothness between resulting segments c and d. In order to conserve computational resources, a quadratic parallel constraint $g_∥(p)$ 264 may be generated, where $\Delta c^⊥=(\Delta c_y, -\Delta c_x)^T$, $\Delta d=c_4-c_3$, and $\Delta c=d_2-d_1$. Parallel tangents between the two resulting segments c and d may be guaranteed by solving for $g_∥(p)=0$. Fit minimization may be iteratively generated based on the linearized constraints 266. The fit minimization may be generated for the resulting segments oriented based on the corresponding original segments of the original path. This allows the fit minimization to be linearly solved to pull the correct orientation without needing additional terms in the non-linearized constraints $g_{G1}(P)$ 262. At each iteration of fit minimization, $½p^TAp - p^Tb$ may be minimized for the linearized constraint rows, such that $C_p=d$. A constrained fit minimization 268 may be solved as a least square solve. Linear system 270 and linear system 272 are then satisfied to satisfy the linear constraints exactly and minimize the fit between the two resulting segments. A KKT system 274 can then be solved, where only a set number of columns and rows are added to the linear solve, with a limited amount of computational resources used, which allows the present system to use sparse linear solvers to find a simplified path with continuity ensured. In some examples, a diagonal legalizer, such as LaGrange multiplier, may be used to generate efficient and accurate sparse linear solvers that are easy to satisfy. The KKT system 274 may then provide a simplified path with continuity similar to that of the original path.

Figure 3A:
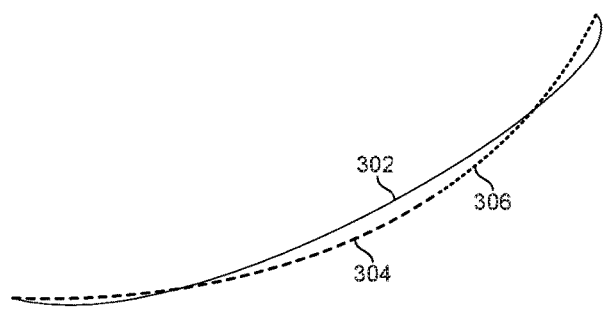
FIGS. 3A-3B are diagrams illustrating conventional simplified paths for original paths.
Figure 3B:
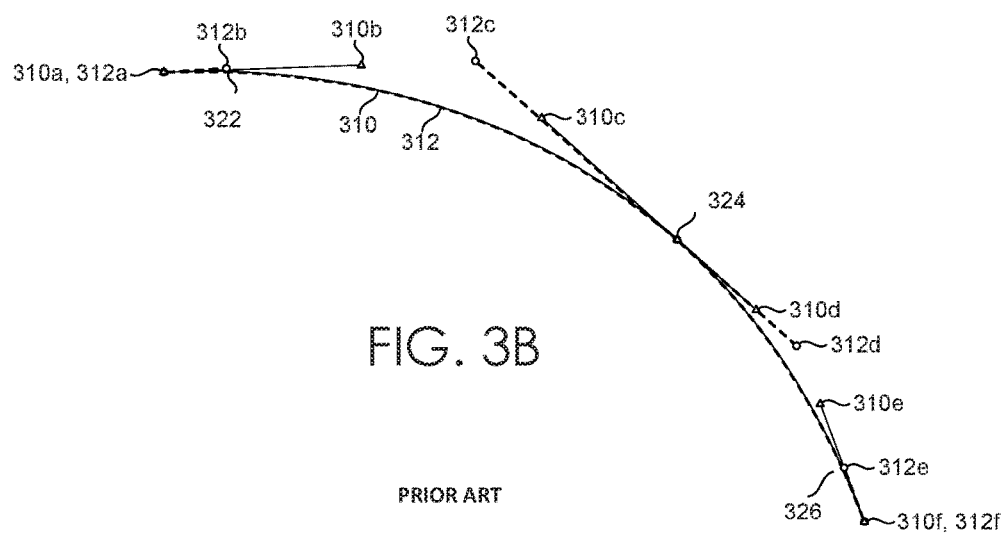

Now referring to FIGS. 3A-3B, FIGS. 3A-3B illustrate conventional simplified paths for original paths. FIG. 3A illustrates an original path 302 fixed with simplified paths 304 and 306 generated using a conventional technique. As can be seen, the combination of simplified paths 304 and 306 significantly deviates in geometry from the original path 306. The conventional technique arbitrarily picks anchor points to match a simplified path. However, this leads to poorly fitted simplified paths as the geometrical information between the chosen anchor points is lost. As a result, the simplified paths only matches the original path at the two chosen anchor points.

Similarly, FIG. 3B illustrates an original path 310 fitted with a simplified path 312 using a conventional technique. The original path 310 and the simplified path 312 overlap completely. However, the simplified anchor points 312a-312f of the simplified path 312 significantly deviate in Euclidean space from the original anchor points 310a-310f of the original path 310 for the same end points 322, 324, and 326. Hence, the deviation function will generate a large deviation value.

Figure 4:
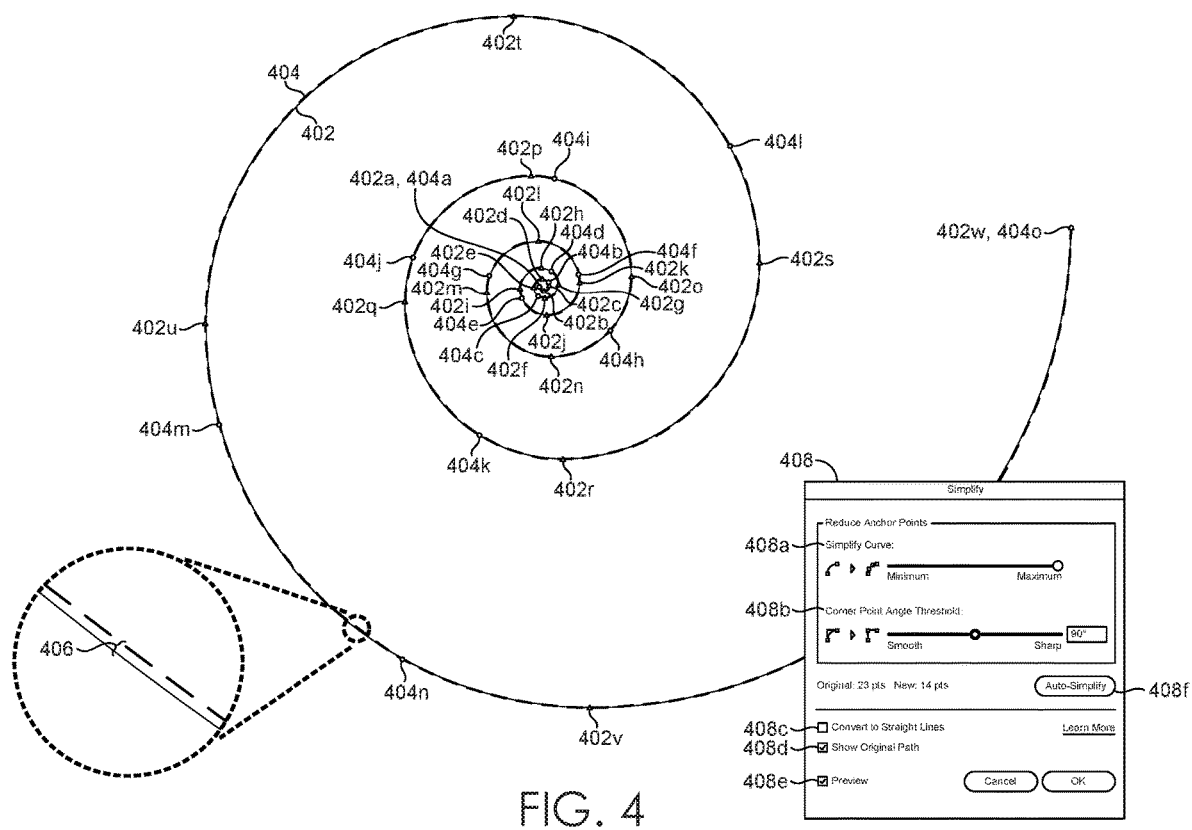
FIG. 4 is a diagram illustrating a simplified path generated from an original path, in accordance with some implementations of the present disclosure.

In contrast, FIG. 4 is an example illustrations of a simplified path 404 generated for an original path 402, in accordance with some implementations of the present disclosure. The original path 402 includes 22 initial segments as illustrated by the twenty three initial anchor points 420a-402w. The simplified path 404 generated using a path simplification system, such as path simplification system 104, includes a total of 15 resulting anchor points connecting 14 resulting segments, while maintaining a low deviation 406 from the original path 402. A user may be provided with an input graphical user interface 408 allowing the user to input metrics for simplifying the original path 402. For example, a simplified curve metric 408a may allow a user to select a metric between minimum and maximum number of anchor points to be used to generate a simplified path. Similarly, a user may also provide corner point angle threshold 408b that defines how much continuity or smoothness to apply between two resulting segments of the simplified path. A user may also choose to auto-simply 408f. The deviation and/or error threshold may be determined based at least in part on the simplify curve metric 408a provided by the user or if the user chooses the option to auto-simplify 408f, the system may automatically determine the thresholds based on the length and/or curvature of the original path 402. In some examples, the user may instead provide a deviation and/or an accuracy value in terms of distance and/or percentage. Further, the user may choose whether to convert to straight lines 408c, show original path 408d, and/or show preview 408e of the resulting simplified path 404. This way the present system may allow a user to customize the simplified path 404 and/or its presentation in a variety of ways.

Figure 5:
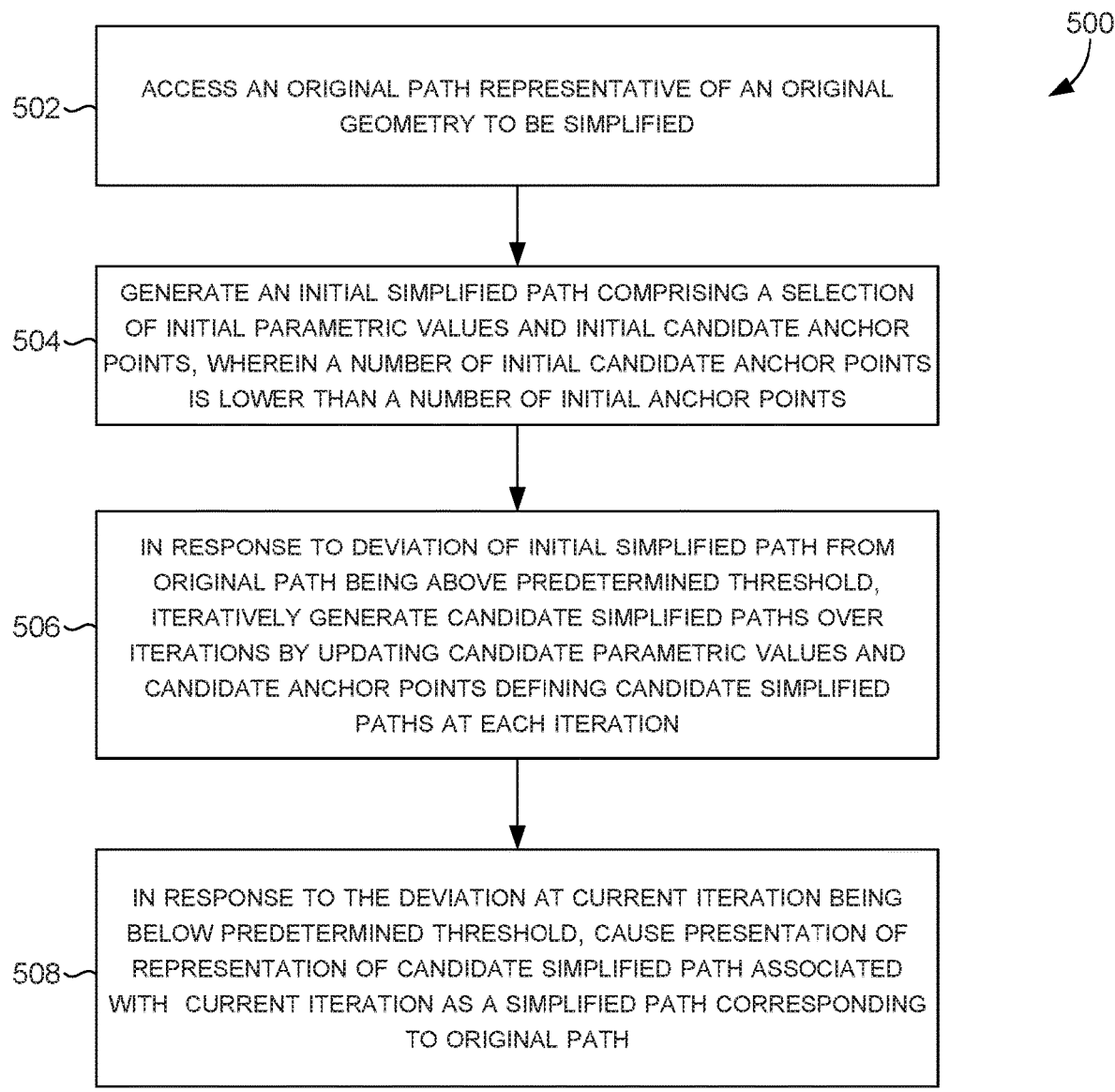
FIG. 5 is a flow diagram showing a method for generating a simplified path for an original path, in accordance with some implementations of the present disclosure.

Referring now to FIG. 5, a flow diagram is provided illustrating a method 500 for generating a simplified path for an original path, in accordance with some implementations of the present disclosure. Each block of the method 500 and any other methods described herein comprises a computing process that may be performed using any combination of hardware, firmware, and/or software. For instance, various functions may be carried out by a processor executing instructions stored in memory. The methods may also be embodied as computer-usable instructions stored on computer storage media. The methods may be provided by a standalone application, a service or hosted service (standalone or in combination with another hosted service), or a plug-in to another product, to name a few. The method 500 may be performed, for instance, by the candidate path module 110 and simplified path update module 112 of FIG. 1.

Initially, as shown at block 502, an original path is accessed. The original path can represent an original geometry to be simplified. The original path can include an initial anchor points and initial segments connecting the initial anchor points. For example, the original path may be accessed from a user device, such as the user device 102 of FIG. 1, by a path simplification system, such as the path simplification system 104. A user may provide the original path to the path simplification system 104 for simplification.

An initial simplified path is then generated, as shown at block 504. The initial simplified path can include initial parametric values and initial candidate anchor points. The number of initial candidate anchor points may be lower than a number of initial anchor points in the original path. In examples, the initial parametric values may correspond to end points of piecewise segments (e.g., subdivided segments) of the original path. In such examples, the initial candidate anchor points may be determined for the initial simplified path based on the initial parametric values and the corresponding end points. A candidate path module, such as the candidate path module 110 of FIG. 1, may be used to generate the initial simplified path.

As shown at block 506, candidate simplified paths may be iteratively generated in response to deviation of the initial simplified path from the original path being above predetermined threshold. Candidate simplified paths may be generated over iterations in response to a deviation value of a candidate simplified path being over the predetermined threshold. At each iteration, candidate parametric values and candidate anchor points defining the candidate simplified path may be updated. The deviation value representing a deviation between the candidate simplified path and the original path. A simplified path update module, such as the simplified path update module 112 of FIG. 1, may be used to iteratively generate candidate simplified paths over iterations. In some examples, the predetermined threshold may be based on a user provided accuracy value and/or percentage.

Further, at block 508, a representation of the candidate simplified path associated with the current iteration as a simplified path corresponding to the original path is presented in response to the deviation at a current iteration being below the predetermined threshold. In this way, the original path may be simplified by decreasing a number of anchor points connecting segments such that the resulting anchor points and the resulting segments represent a simplified geometry that deviates from the original geometry by less than the predetermined threshold.

Having described implementations of the present disclosure, an exemplary operating environment in which embodiments of the present invention may be implemented is described below in order to provide a general context for various aspects of the present disclosure. Referring to FIG. 6 in particular, an exemplary operating environment for implementing embodiments of the present invention is shown and designated generally as computing device 600. Computing device 600 is but one example of a suitable computing environment and is not intended to suggest any limitation as to the scope of use or functionality of the invention. Neither should the computing device 600 be interpreted as having any dependency or requirement relating to any one or combination of components illustrated.

The invention may be described in the general context of computer code or machine-useable instructions, including computer-executable instructions such as program modules, being executed by a computer or other machine, such as a personal data assistant or other handheld device. Generally, program modules including routines, programs, objects, components, data structures, etc., refer to code that perform particular tasks or implement particular abstract data types. The invention may be practiced in a variety of system configurations, including hand-held devices, consumer electronics, general-purpose computers, more specialty computing devices, etc. The invention may also be practiced in distributed computing environments where tasks are performed by remote-processing devices that are linked through a communications network.

With reference to FIG. 6, computing device 600 includes bus 610 that directly or indirectly couples the following devices: memory 612, one or more processors 614, one or more presentation components 616, input/output (I/O) ports 618, input/output components 620, and illustrative power supply 622. Bus 610 represents what may be one or more busses (such as an address bus, data bus, or combination thereof). Although the various blocks of FIG. 6 are shown with lines for the sake of clarity, in reality, delineating various components is not so clear, and metaphorically, the lines would more accurately be grey and fuzzy. For example, one may consider a presentation component such as a display device to be an I/O component. Also, processors have memory. The inventors recognize that such is the nature of the art, and reiterate that the diagram of FIG. 6 is merely illustrative of an exemplary computing device that can be used in connection with one or more embodiments of the present invention. Distinction is not made between such categories as "workstation," "server," "laptop," "hand-held device," etc., as all are contemplated within the scope of FIG. 6 and reference to "computing device."

Computing device 600 typically includes a variety of computer-readable media. Computer-readable media can be any available media that can be accessed by computing device 500 and includes both volatile and nonvolatile media, removable and non-removable media. By way of example, and not limitation, computer-readable media may comprise computer storage media and communication media. Computer storage media includes both volatile and nonvolatile, removable and non-removable media implemented in any method or technology for storage of information such as computer-readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by computing device 600. Computer storage media does not comprise signals per se. Communication media typically embodies computer-readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of any of the above should also be included within the scope of computer-readable media.

Memory 612 includes computer-storage media in the form of volatile and/or nonvolatile memory. The memory may be removable, non-removable, or a combination thereof. Exemplary hardware devices include solid-state memory, hard drives, optical-disc drives, etc. Computing device 600 includes one or more processors that read data from various entities such as memory 612 or I/O components 620. Presentation component(s) 616 present data indications to a user or other device. Exemplary presentation components include a display device, speaker, printing component, vibrating component, etc.

I/O ports 618 allow computing device 600 to be logically coupled to other devices including I/O components 620, some of which may be built in. Illustrative components include a microphone, joystick, game pad, satellite dish, scanner, printer, wireless device, etc. The I/O components 620 may provide a natural user interface (NUI) that processes air gestures, voice, or other physiological inputs generated by a user. In some instance, inputs may be transmitted to an appropriate network element for further processing. A NUI may implement any combination of speech recognition, touch and stylus recognition, facial recognition, biometric recognition, gesture recognition both on screen and adjacent to the screen, air gestures, head and eye-tracking, and touch recognition associated with displays on the computing device 600. The computing device 600 may be equipped with depth cameras, such as, stereoscopic camera systems, infrared camera systems, RGB camera systems, and combinations of these for gesture detection and recognition. Additionally, the computing device 600 may be equipped with accelerometers or gyroscopes that enable detection of motion.

The subject matter of the present invention is described with specificity herein to meet statutory requirements. However, the description itself is not intended to limit the scope of this patent. Rather, the inventors have contemplated that the claimed subject matter also might be embodied in other ways, to include different steps or combinations of steps similar to the ones described in this document, in conjunction with other present and/or future technologies. Moreover, although the terms "step" and/or "block" may be used herein to connote different elements of methods employed, the terms should not be interpreted as implying any particular order among or between various steps herein disclosed unless and except when the order of individual steps is explicitly described.

As described above, implementations of the present disclosure generally relate to generating simplified path for original paths by decreasing a number of anchor points while conforming to the shape of the original path (i.e., decreasing deviation). Embodiments of the present invention have been described in relation to particular aspects, which are intended in all respects to be illustrative rather than restrictive. Alternative embodiments will become apparent to those of ordinary skill in the art to which the present invention pertains without departing from its scope.

From the foregoing, it will be seen that this invention is one well adapted to attain all the ends and objectives set forth above, together with other advantages which are obvious and inherent to the system and method. It will be understood that certain features and subcombinations are of utility and may be employed without reference to other features and subcombinations. This is contemplated by and is within the scope of the claims.

What is claimed is:

1. One or more computer storage media storing computer-useable instructions that, when used by one or more computing devices, cause the one or more computing devices to perform operations comprising:
   obtaining an original path comprising initial anchor points;
   determining a simplified path corresponding with the original path and having a set of anchor points that is less than the initial anchor points of the original path, wherein determining the simplified path comprises:
   determining a candidate simplified path using parametric values and a subset of anchor points of the set of anchor points, wherein determining the candidate simplified path comprises iteratively:
      updating the parametric values and the subset of anchor points associated with a previous candidate simplified path of a previous iteration based on a prior deviation between the subset of anchor points of the previous candidate simplified path and the original path to generate the candidate simplified path; and
      at each iteration, identifying a deviation between the candidate simplified path and the original path, wherein the deviation is determined using a distance function that indicates a distance between the subset of anchor points of the candidate simplified path to a corresponding segment of the original path, wherein, during at least one iteration, a first section of the candidate simplified path is maintained based on a portion of the deviation associated with the first section of the candidate simplified path being below a fraction of a deviation threshold; and
   based on a particular deviation of a particular iteration being below the deviation threshold, providing the candidate simplified path as the simplified path.

2. The computer storage media of claim 1, wherein the parametric values correspond to end points of subdivided segments of the candidate simplified path.

3. The computer storage media of claim 1, the operation further comprising:

dividing the original path into subdivided segments, each subdivided segment represented by a pair of original end points;
determining an initial simplified path with initial subdivided segments corresponding to initial end points, the initial end points having a corresponding one-to-one correspondence with the original end points;
determining an initial parametric value for each of the initial end points; and
for a first iteration, determining anchor points for the candidate simplified path based on the initial parametric values and the initial end points.

4. The computer storage media of claim 3, wherein dividing the original path into the subdivided segments is based at least in part on a length and curvature of the original path.

5. The computer storage media of claim 3, wherein the initial parametric values are determined using an arc length parameterization algorithm.

6. The computer storage media of claim 1, wherein the deviation threshold is a predetermined threshold value determined based at least in part on a user provided accuracy value.

7. The computer storage media of claim 1, wherein the deviation is a Euclidian distance between the candidate simplified path and the original path.

8. The computer storage media of claim 1, the operations further comprising determining, at each iteration, the deviation between the candidate simplified path and the original path based at least in path on a Euclidian distance between at least one end point on the original path and a corresponding candidate end point on the candidate simplified path.

9. The computer storage media of claim 1, the operations further comprising updating the parametric values at each iteration based at least in part on gradient descent.

10. The computer storage media of claim 9, wherein the gradient descent includes a velocity that is modulated based on a linesearch algorithm.

11. The computer storage media of claim 1, the operations further comprising updating the anchor points at each iteration based at least in part on a least square method.

12. The computer storage media of claim 1, further comprising:
applying a continuity constraint to the candidate simplified path, the continuity constraint ensuring continuity between two adjacent anchor points; and
causing for display the candidate simplified path associated with the particular iteration.

13. The computer storage media of claim 1, further comprising causing for display the candidate simplified path associated with the particular iteration by appending the candidate simplified path and corresponding anchor points to the original path.

14. A method comprising:
accessing an original path representative of an original geometry to be simplified, the original path comprising initial anchor points and initial segments connecting the anchor points;
simplifying the original path by decreasing a number of initial anchor points connecting initial segments by:
generating an initial simplified path comprising a selection of initial parametric values and initial candidate anchor points selected from a subset of initial anchor points of the initial anchor points, wherein a number of the initial candidate anchor points is less than a number of the initial anchor points;
based on a deviation of the initial simplified path from the original path being above a predetermined threshold, iteratively generating candidate simplified paths, each candidate simplified path generated in response to a deviation value of a current candidate simplified path being over the predetermined threshold, by updating candidate parametric values and candidate anchor points selected from a subset of the initial candidate anchor points corresponding to a previous candidate simplified path of a previous iteration, wherein the candidate parametric values and the candidate anchor points define the candidate simplified path at each iteration and the deviation value representing a deviation between the current candidate simplified path and the original path, wherein the deviation is determined using a distance function that calculates the distance of anchor points of the current candidate simplified path to a corresponding segment of the original path;
at each iteration, in response to the deviation value being above an error threshold, determining an end point on the original path where a distance between the end point and a corresponding candidate end point on the candidate simplified path is above a predetermined fraction of the error threshold and, as a result, causing a first portion of the current candidate simplified path to be maintained as at least a portion of a simplified path corresponding to the original path; and
in response to the deviation value at a current iteration being below the predetermined threshold, causing presentation of a representation of the candidate simplified path associated with the current iteration as the simplified path corresponding to the original path.

15. The method of claim 14, further comprising:
dividing the original path into subdivided segments, each subdivided segment represented by a pair of end points, the initial parametric values associated with candidate end points on the initial simplified path corresponding to the end points of the original path;
at each iteration, determining the deviation value by calculating, for each end point on the original path, a distance between the end point and corresponding candidate end point on the candidate simplified path, the deviation value being the sum of the distances.

16. The method of claim 14, further comprising:
iteratively generating candidate simplified paths over iterations for the first portion of the current candidate simplified path and a second portion of the current candidate simplified path; and
for each of the first portion of the current candidate simplified path and the second portion of the current candidate simplified path, in response to the deviation value at a particular iteration being less than the predetermined threshold, causing presentation of a representation of the candidate simplified path associated with the particular iteration as a simplified path corresponding to the original path, wherein the candidate simplified paths are caused to be presented with a last end point of the first portion of the current candidate simplified path joined with a beginning end point of the second portion of the current candidate simplified path.

17. The method of claim 16, further comprising applying a linearized continuity constraint to the last end point and the beginning end point prior to causing presentation of the candidate simplified paths.

18. The method of claim 14, wherein updating candidate parametric values and candidate anchor points defining the candidate simplified path at each iteration comprises performing a least square solve on the candidate anchor points associated with a previous candidate simplified path and computing updated candidate parametric values based on the least square solve and a gradient descent.

19. The method of claim 14, further comprising:
obtaining a second portion of the current candidate simplified path that is distinct from the first portion; and
wherein the candidate simplified path is determined based on the second portion of the current candidate simplified path.

20. A computing system comprising:
one or more hardware processors and memory configured to provide computer program instructions to the one or more hardware processors;
a learning engine configured to use the one or more hardware processors to:
  access an original path comprising initial segments associated with corresponding initial anchor points representing an input geometry;
  divide the original path into a set of subdivided segments associated with corresponding set of end points based at least in part on one of a length of the original path, a curvature of the original path, and a predetermined deviation threshold;
  generate an initial simplified path comprising a selection of initial parametric values associated with the set of end points and initial candidate anchor points selected from the initial anchor points, wherein a number of initial candidate anchor points is less than a number of initial anchor points in the original path;
  in response to a deviation value, determined using a distance function that calculates a distance between a first section of the original path and a first section of the initial simplified path corresponding to the first section of the original path being over a first fraction of the predetermined deviation threshold, determine a second section of the initial simplified path to be maintained; and
  for the second section of the initial simplified path, determine a simplified path where the deviation value is less than the predetermined deviation threshold.

* * * * *